(12) United States Patent
Satou et al.

(10) Patent No.: US 7,083,863 B2
(45) Date of Patent: Aug. 1, 2006

(54) LUMINOUS ELEMENT AND METHOD FOR PREPARATION THEREOF

(75) Inventors: Tetsuya Satou, Osaka (JP); Mikiko Matsuo, Nara (JP); Hisanori Sugiura, Osaka (JP); Tsuyoshi Uemura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 294 days.

(21) Appl. No.: 10/468,663

(22) PCT Filed: Feb. 18, 2002

(86) PCT No.: PCT/JP01/01342

§ 371 (c)(1),
(2), (4) Date: Nov. 10, 2003

(87) PCT Pub. No.: WO02/067632

PCT Pub. Date: Aug. 29, 2002

(65) Prior Publication Data

US 2005/0194586 A1    Sep. 8, 2005

(30) Foreign Application Priority Data

Feb. 21, 2001    (JP) .............................. 2001-044728

(51) Int. Cl.
*H05B 33/12* (2006.01)
*H01L 29/08* (2006.01)
(52) U.S. Cl. .................. 428/690; 428/917; 257/40; 257/E51.049; 257/E51.051; 313/504; 313/506
(58) Field of Classification Search ................ 428/690, 428/917; 257/40, E51.051; 313/504, 506; 427/250, 248.1, 252, 255.31, 255.11
See application file for complete search history.

(56) References Cited

U.S. PATENT DOCUMENTS 4,539,507 A    9/1985    VanSlyke et al. ............ 313/504
(Continued)

FOREIGN PATENT DOCUMENTS

EP    0 805 143    11/1997
(Continued)

OTHER PUBLICATIONS

Tang, C. W. et al.,1987, "Organic electroluminescent diodes", in Appl. Phys. Lett., 51(12), pp. 913-915.
(Continued)

*Primary Examiner*—Rena Dye
*Assistant Examiner*—Carnie S. Thompson
(74) *Attorney, Agent, or Firm*—Hamre, Schumann, Mueller & Larson, P.C.

(57) ABSTRACT

A light-emitting element having at least a light-emitting region arranged between a pair of electrodes is provided, in which the light-emitting region contains either (A) a light-emitting material, a compound capable of sustaining the charge transport, and a heavy metal as a mixture, or (B) a compound that is capable of sustaining the charge transport and that includes both of a portion for contributing to the charge transport and a portion for contributing to the light emission within the compound, and a heavy metal as a mixture. A method for producing the light-emitting element, and a display device in which a plurality of the light-emitting elements are used, are provided also. With the light-emitting element of the present invention, it is possible to provide an organic thin film electroluminescent element that has a high emission efficiency, whose materials are easy to synthesize as compared with a heavy metal complex-doped element that has been studied widely in recent years, that has a small concentration quenching, and that is stable and uniform. Therefore, the light-emitting element of the present invention is applicable as a light source for use in a flat-panel-type self-luminous display device and for other various purposes such as communication and illumination.

21 Claims, 2 Drawing Sheets

U.S. PATENT DOCUMENTS

| | | | |
|---|---|---|---|
| 5,085,947 A | 2/1992 | Saito et al. | 428/690 |
| 6,416,887 B1 | 7/2002 | Tokito et al. | 428/690 |
| 2002/0045063 A1 | 4/2002 | Kim et al. | 428/690 |
| 2002/0045064 A1 | 4/2002 | Kim et al. | 428/690 |
| 2002/0045065 A1 | 4/2002 | Kim et al. | 428/690 |
| 2005/0194586 A1* | 9/2005 | Satou et al. | 257/40 |

FOREIGN PATENT DOCUMENTS

| | | |
|---|---|---|
| GB | 1 493 813 | 11/1977 |
| JP | 2-250292 | 11/1984 |
| JP | 59-194393 | 10/1990 |
| JP | 5-217675 | 8/1993 |
| JP | 9-328680 | 12/1997 |
| JP | 11-260559 | 9/1999 |
| JP | 2000-53957 | 2/2000 |
| JP | 2001-240854 | 9/2001 |
| JP | 2002-203687 | 7/2002 |

OTHER PUBLICATIONS

Baldo, M. A., et al., 1999, "Very high-efficiency green organic light-emitting devices based on electrophosphorescence", in Appl. Phys. Lett., 75 (1), pp. 4-6.

Baldo. M. A., 1998, Highly efficient phosphorescent emission from organic electroluminescent devices, in NATURE, vol. 395, pp. 151-154.

* cited by examiner

LUMINOUS ELEMENT AND METHOD FOR PREPARATION THEREOF

TECHNICAL FIELD

The present invention relates to a thin film electroluminescent (EL) element such as, for instance, a self-luminous light-emitting element, which is suitable as a light source for use in a flat-panel-type self-luminous display device and for other various purposes such as communication and illumination. It also relates to a method for producing the same, and to a display device employing the same.

BACKGROUND ART

Recently, among flat-panel-type display devices, liquid crystal display (LCD) panels are used widely, but they still have problems such as a low response speed, a narrow viewing angle, etc., and most of improved versions of these also have problems such as insufficient properties and high costs of panels. Among these, thin film EL elements have drawn attention as new expected self-luminous light-emitting elements with excellent visibility and high response speeds, which are expected to be applicable in a wide range of fields. Particularly, various studies have been carried out about thin film EL elements having layers all of which, or a part of which, are made of organic materials that can be formed into films by simple film forming processes such as vapor deposition or application at room temperature, which are called organic EL elements. This is because they are attractive due to, in addition to the above-described characteristics, their production costs being reducible to relatively low levels.

A thin film EL element that operates in a direct-current electric field (organic electroluminescent element, hereinafter referred to as "organic EL element" for short) has a light-emitting region present between a pair of electrodes, that is, a hole-injection electrode and a cathode (electron-injection electrode), and achieves light emission by recombination of an electron and a positive hole injected from the foregoing electrodes. Many studies have been made about such an organic EL element, but the emission efficiency thereof generally has been low and they have been far from practical application in a light-emitting element.

Among these, an element proposed by Tang et al. in 1987 (C. W. Tang and S. A. Vanslyke: Applied Physics Letter 51(1987)913 (issue date: Sep. 21, 1987)) was an element having a hole-injection electrode, a hole-transport layer, a light-emitting layer, and a cathode that were provided on a transparent substrate in the stated order, in which indium tin oxide (ITO) was used as the hole-injection electrode, a 75 nm-thick diamine derivative layer was used as the hole-transport layer, and a 60 nm-thick aluminum quinoline complex layer was used as a light-emitting layer, and the cathode was made of a MgAg alloy that has both of the electron-injection capability and the stability against the degradation. In addition to the improvement of the cathode, the use of diamine derivative excellent in transparency for forming the hole-transport layer particularly allowed the hole-transport layer even with a thickness of 75 nm to maintain sufficient transparency, and this thickness made it possible to obtain a uniform thin film without a pin hole or the like. Therefore, this sufficiently reduced a total thickness of an element including the light-emitting layer (to approximately 150 nm), thereby allowing light emission with high luminance to be obtained with a relatively low voltage. More specifically, high luminance of not less than 1000 cd/m$^2$ and high efficiency of not less than 1.51 m/W were obtained with a low voltage of not more than 10 V. This report by Tang et al. initiated active studies for the further improvement of the cathode, and the improvement of the element configuration such as the insertion of an electron-injection layer and the insertion of the hole-injection layer, which have been continued to date.

The following will summarize a thin film EL (organic EL) element that is being studied generally.

To form respective layers of the element, a hole-injection electrode, a hole-transport layer, a light-emitting layer, and a cathode are laminated in the stated order on a transparent substrate. Further, a hole-injection layer may be provided as required between the hole-injection electrode and the hole-transport layer, an electron-transport layer may be provided as required between the light-emitting layer and the cathode, or an electron-injection layer may be provided as required on an interface with the cathode. Thus, by dividing and distributing functions to the respective layers, appropriate materials can be selected for the layers, respectively, thereby improving the characteristics of the element.

Generally, a glass substrate such as "CORNING 1737" (non-alkali borosilicate glass produced by Corning Glass Works) is used widely as the transparent substrate. The substrate preferably has a thickness of approximately 0.7 mm since this makes the substrate easy to handle from the viewpoint of strength and weight.

As the hole-injection electrode, a transparent electrode is used, such as an ITO sputtered film, an ITO electron beam vapor deposition film, or an ITO ion-plating film. The thickness thereof is determined according to a sheet resistance and a visible light transmittance that are required, but in many cases it is set to be not less than 100 nm so as to decrease the sheet resistance, since a driving current density is relatively high in an organic EL element.

For forming the hole-transport layer, a film obtained by vapor deposition of a diamine derivative is used widely, for instance, a diamine derivative used by Tang et al. such as N,N'-bis(3-methylphenyl)-N,N'-diphenylbenzidine (hereinafter referred to as TPD), or N,N'-bis($\alpha$-naphtyl)-N,N'-diphenylbenzidine (hereinafter referred to as NPD). Particularly, a film obtained by vapor deposition of a diamine derivative having a $Q^1$-G-$Q^2$ structure disclosed in U.S. Pat. No. 4,539,507 (issue date: Sep. 3, 1985) (corresponding to JP 2037475 B (JP 59-194399A (publication date: Nov. 5, 1984)) is used widely. It should be noted that each of $Q^1$ and $Q^2$ is a group containing a nitrogen atom and at least three carbocyclic rings (at least one of which is aromatic), and G is a linking group composed of a cycloalkylene group, an arylene group, an alkylene group, or a carbon-to carbon bond. These materials generally have excellent transparency such that they are substantially transparent even if it is formed into a film having a thickness of approximately 80 nm, and have excellent film forming properties. Therefore, by using the same, it is possible to form a film without defects such as pin holes, and problems relating to the reliability such as short-circuit hardly occur, even if a total thickness of the element is reduced to approximately 100 nm.

The light-emitting layer also is, as reported by Tang et al., formed by vapor deposition of an electron-transport light-emitting material such as tris(8-quinolinolato)aluminum so as to have a thickness of several tens of nanometers. For achieving emitted lights of various colors, the light-emitting layer is a relatively thin film, and in some cases, a so-called double hetero structure having an electron-transport layer with a thickness of approximately 20 nm is used.

In many cases, the cathode used is a cathode made of an alloy such as a MgAg alloy or an AlLi alloy proposed by Tang et al., or a layered cathode. The alloy forming the cathode is an alloy of a metal that has a low work function and a low electron-injection barrier and a metal that has a relatively high work function and is stable. The layered cathode is formed by laminating, for instance, an electron-injection layer of various types such as LiF and aluminum.

Further, in addition to such a lamination configuration of "hole-transport layer/electron-transport light-emitting layer", the configuration of "hole-transport light-emitting layer/electron-transport layer", and the configuration of "hole-transport layer/light-emitting layer/electron-transport layer" are used widely. With use of any one of the lamination configuration, the same transparent substrate, hole-injection electrode, and cathode as those described above are used in the same manner.

Generally, it is almost impossible to obtain organic compounds that have excellent electron transport capability, and relatively limited compounds can be used for forming the lamination configuration of "hole-transport layer/electron-transport light-emitting layer". In contrast, in the case of the configurations of "hole-transport light-emitting layer/electron-transport layer" and "hole-transport layer/light-emitting layer/electron-transport layer", various types of materials can be used for forming light-emitting layers. Therefore, they have possibilities for providing various colors of light and high performance in the efficiency and the lifetime, and hold high expectations.

For instance, U.S. Pat. No. 5,085,947 (issue date: Feb. 4, 1992) [corresponding to JP 2-250292A, date of publication: Oct. 8, 1990] discloses an element with a configuration of "hole-transport light-emitting layer/electron-transport layer" in which
[4-{2-(naphthalen-1-yl)vinyl}phenyl]bis(4-methoxyphenyl) amine, or
[4-(2,2-diphenylvinyl)phenyl]bis(4-methoxyphenyl)amine
is used as a hole-transport light-emitting material, and an oxadiazole derivative is used for forming an electron-transport layer.

Further, WO 96/22273 (international publication date: Jul. 25, 1996) discloses an organic thin film EL element having a configuration of "hole-transport layer/light-emitting layer/electron-transport layer" in which 4,4'-bis(2,2-diphenyl-1-vinyl)-1,1'-biphenyl, which is a hole-transport light-emitting material, is used for forming a light-emitting layer.

Still further, in the Spring Annual Session G2.1 Lecture of Material Research Society (MRS) in 1998 (oral presentation, Apr. 13, 1994), an element was reported that has a configuration of "hole-injection layer/hole-transport light-emitting layer/hole blocking layer/electron-transport layer" in which NPD, which is a compound of the $Q^1$-G-$Q^2$ type proposed by Tang et al., is used as a hole-transport light-emitting material.

Thus, the use of not only an electron-transport light-emitting material but also a hole-transport light-emitting material as a light-emitting material enables the designing with a wide-range of materials, and allows light emission with various colors to be obtained. However, it still has not been possible to obtain those with sufficient characteristics regarding the emission efficiency and lifetime. In particular, it is said that in the case where a fluorescent material is used, only 25% of an excited state generated by recombination of an electron and a hole contributes to light emission, and this has been a significant problem in pursuing a further improved efficiency.

In such a situation, recently, many studies have been done about an element in which a light-emitting layer obtained by doping a host material with a heavy metal complex, as disclosed in Applied Physics Letter, vol. 75, No. 1, pages 4 to 6 (issue date: Jul. 5, 1999). It is reported that in such an element, due to a heavy metal effect, a triplet exciton that is said to inherently make a forbidden transition and therefore does not contribute to light emission is caused to make a luminescent transition to a ground state, thereby allowing the triplet exciton, which is said to be generated at a rate of 75%, to be used in light emission. Therefore, the foregoing element can achieve a higher efficiency.

However, fac tris(2-phenylpyridine)iridium [abbreviated as "Ir(ppy)3"] disclosed in the foregoing thesis and many other heavy metal complexes cannot necessarily be synthesized or purified easily. On the other hand, a layer made of a single material does not have a sufficient charge transport capability, and exhibits significant concentration quenching (the decrease of the emission intensity at or above a certain concentration). Therefore, it has been usual to use a charge transport host material doped with a heavy metal complex at an appropriate concentration, but the efficiency and the lifetime depend on the dopant concentration, thereby causing disadvantages in the production.

Considering these conditions, the inventors of the present invention not only designed heavy metal complex materials of various structures and studied characteristics thereof in detail, but also studied a wide range of light-emitting elements in each of which a light-emitting layer contained a mixture of a heavy metal and a compound that were selected from a variety of the same and that were deposited independently from each other. As a result, the inventors found the following. A heavy metal and a compound for contributing to light emission need not be one compound as a complex. Even in the case where a compound for contributing to light emission and a heavy metal physically were mixed and present close to each other, it was observed widely that the emission efficiency was improved significantly as compared with the case where no heavy metal was contained. With this, the present invention was completed. Further, the inventors also found that the emission efficiency further improved in the case where the heavy metal mixed therein was in as fine a state as possible. Thus, the present invention was completed.

SUMMARY OF THE INVENTION

More specifically, the light-emitting element of the present invention, the method for producing the same, and the display device employing the same are as follows.

(1) A light-emitting element having at least a light-emitting region between a pair of electrodes, wherein the light-emitting region contains a mixture of a light-emitting material; a compound capable of sustaining charge transport; and a heavy metal.

(2) A light-emitting element having at least a light-emitting region between a pair of electrodes, wherein the light-emitting region is made of a mixture of a light-emitting material, a compound capable of sustaining charge transport, and a heavy metal, the mixture being obtained by simultaneously depositing the light-emitting material, the compound, and the heavy metal.

(3) The light-emitting element according to the item (1) or (2),
wherein a content of the heavy metal in the light-emitting region is in a range of 0.1 mol % to 50 mol % with respect to the light-emitting material.

(4) The light-emitting element according to the item (1) or (2), wherein the heavy metal mixed is in an ultrafine particle state that is selected from an atomic particle state and cluster particle states in which each cluster particle has not more than ten atoms of the heavy metal on average.

(5) The light-emitting element according to the item (1) or (2), wherein the heavy metal mixed is in an ultrafine particle state that is selected from an atomic particle state and cluster particle states in which each cluster particle has not more than five atoms of the heavy metal on average.

(6) A light-emitting element having at least a light-emitting region between a pair of electrodes, wherein the light-emitting region contains a mixture of a compound that is capable of sustaining charge transport and that includes both of a portion for contributing charge transport and a portion for contributing to light emission within the compound; and a heavy metal.

(7) A light-emitting element having at least a light-emitting region between a pair of electrodes, wherein the light-emitting region is made of a mixture of a compound that is capable of sustaining charge transport and that includes both of a portion for contributing charge transport and a portion for contributing to light emission within the compound; and a heavy metal, the mixture being obtained by simultaneously depositing the compound and the heavy metal.

(8) The light-emitting element according to the item (6) or (7), wherein the compound capable of sustaining the charge transport is a hole-transport light-emitting material that includes both of a portion for contributing to the charge transport and a portion for contributing to the light emission within the compound.

(9) The light-emitting element according to the item (6) or (7), wherein a content of the heavy metal in the light-emitting region is in a range of 0.1 mol % to 50 mol % with respect to the compound that is capable of sustaining charge transport and that includes both of a portion for contributing charge transport and a portion for contributing to light emission within the compound.

(10) The light-emitting element according to the item (6) or (7), wherein the heavy metal mixed is in an ultrafine particle state that is selected from an atomic particle state and cluster particle states in which each cluster particle has not more than ten atoms of the heavy metal on average.

(11) The light-emitting element according to the item (6) or (7), wherein the heavy metal mixed is in an ultrafine particle state that is selected from an atomic particle state and cluster particle states in which each cluster particle has not more than five atoms of the heavy metal on average.

(12) A light-emitting element having at least a light-emitting region between a pair of electrodes, wherein the light-emitting region contains a mixture of a light-emitting material; a compound capable of sustaining charge transport; and a heavy metal, and the light-emitting region exhibits an increased ratio of light emission with respect to a recombination of unit charges, as compared with the case where the light-emitting region is made of a mixture of only a light-emitting material and a compound capable of sustaining charge transport.

(13) A light-emitting element having at least a light-emitting region between a pair of electrodes, wherein the light-emitting region contains a mixture of a compound that is capable of sustaining charge transport and that includes both of a portion for contributing charge transport and a portion for contributing to light emission within the compound; and a heavy metal, and the light-emitting region exhibits an increased ratio of light emission with respect to a recombination of unit charges, as compared with the case where the light-emitting region is made of only a compound that is capable of sustaining charge transport and that includes both of a portion for contributing charge transport and a portion for contributing to light emission within the compound.

(14) The light-emitting element according to the item (12) or (13), wherein the heavy metal mixed is in an ultrafine particle state that is selected from an atomic particle state and cluster particle states in which each cluster particle has not more than ten atoms of the heavy metal on average.

(15) The light-emitting element according to item (12) or (13), wherein the heavy metal mixed is in an ultrafine particle state that is selected from an atomic particle state and cluster particle states in which each cluster particle has not more than five atoms of the heavy metal on average.

(16) The light-emitting element according to any one of items (1), (2), (6), (7), (12), and (13), wherein the heavy metal comprises a metal with an atomic number of not less than 57.

(17) A method for producing a light-emitting element having at least a light-emitting region between a pair of electrodes, the method comprising forming at least one layer in the light-emitting region by simultaneously depositing a light-emitting material, a compound capable of sustaining charge transport, and a heavy metal.

(18) The method according to the item (17), wherein the deposition of the heavy metal is deposition via a cracking means.

(19) A method for producing a light-emitting element having at least a light-emitting region between a pair of electrodes, the method comprising forming at least one layer in the light-emitting region by simultaneously depositing a compound that is capable of sustaining charge transport and that includes both of a portion for contributing charge transport and a portion for contributing to light emission within the compound, and a heavy metal.

(20) The method according to the item (19), wherein the deposition of the heavy metal is deposition via a cracking means.

(21) The light-emitting element according to any one of the items (17) to (20), wherein the heavy metal comprises a metal with an atomic number of not less than 57.

(22) A display device employing a plurality of light-emitting elements, each of the light-emitting elements having at least a light-emitting region between a pair of electrodes, wherein the light-emitting region in each light-emitting element contains a mixture of: a light-emitting material; a compound capable of sustaining charge transport; and a heavy metal.

(23) A display device employing a plurality of light-emitting elements, each of the light-emitting elements having at least a light-emitting region between a pair of electrodes, wherein the light-emitting region in each light-emitting element contains a mixture of a compound that is capable of sustaining charge transport and that includes both of a portion for contributing charge transport and a portion for contributing to light emission within the compound; and a heavy metal.

(24) The display device according to the item (22) or (23), wherein the heavy metal mixed is in an ultrafine particle state that is selected from an atomic particle state and cluster particle states in which each cluster particle has not more than ten atoms of the heavy metal on average.

(25) The display device according to the item (22) or (23), wherein the heavy metal mixed is in an ultrafine particle state that is selected from an atomic particle state and cluster particle states in which each cluster particle has not more than five atoms of the heavy metal on average.

(26) The display device according to the item (22) or (23), wherein the heavy metal comprises a metal with an atomic number of not less than 57.

(27) A light-emitting element comprising an organic light-emitting layer that contains a heavy metal as a substance mixed therein.

DETAILED DESCRIPTION OF THE INVENTION

The following will describe a thin film EL element (organic EL element) according to an embodiment of the present invention.

A light-emitting element of the present invention has at least a light-emitting region arranged between a pair of electrodes. Here, a light-emitting element having "at least a light-emitting region arranged between a pair of electrodes" is composed of at least a pair of electrodes and a light-emitting function layer arranged anywhere between the foregoing electrodes. For instance, the element may be composed of at least a hole-injection electrode, an electron-injection electrode on an opposite side to the hole-injection electrode, and a light-emitting function layer that is interposed directly or indirectly between the foregoing two electrodes. Here, the light-emitting function layer refers to not only a light-emitting layer that actually emits light, but also, generically, various configurations such as (1) "hole-transport layer/electron-transport light-emitting layer", (2) "hole-transport light-emitting layer/electron-transport layer", and (3) "hole-transport layer/light-emitting layer/electron-transport layer" (it should be noted that the light-emitting layer includes an electron-transport light-emitting layer, a hole-transport light-emitting layer, etc.).

The "light-emitting region" described herein indicates a layer that actually emits light, among the light-emitting function layer as described above. In other words, it is the electron-transport light-emitting layer in the case of (1), the hole-transport light-emitting layer in the case of (2), or a portion corresponding to the light-emitting layer in the case of (3).

The present invention is characterized in that a heavy metal is present as a material mixed in the materials forming the light-emitting region of the organic EL element.

The light-emitting region used in the present invention can be classified in more detail into categories including, for instance, the following types (A) and (B):

(A) a light-emitting region containing a mixture of
a light-emitting material (a);
a compound (b1) capable of sustaining the charge transport; and
a heavy metal (c);
and,
(B) a light-emitting region containing a mixture of
a compound (b2) that is capable of sustaining the charge transport and that includes both of a portion for contributing to the charge transport and a portion for contributing to the light emission within the compound itself, and
a heavy metal (c).

It should be noted that in the case where a compound having a smaller charge transport function is used as the compound (b2) that is capable of sustaining the charge transport and that includes both of a portion for contributing to the charge transport and a portion for contributing to the light emission within the compound itself, the compound (b1) capable of sustaining the charge transport may be used also in combination as required, so that the light-emitting region contains the compound (b2), the compound (b1), and the heavy metal (c) as a mixture.

Among those described above, particularly the light-emitting region of the type (B) is preferable since in that case a film constituting the light-emitting region can be formed uniformly in a large area at a high yield stably.

Regarding the compound (b1) in the light-emitting region of the type (A), the compound (b1) capable of sustaining charge transport does not emit light if it is used alone, which is a common technological knowledge about organic thin film EL elements. Therefore, the compound (b1) capable of sustaining charge transport is used in a state in which the compound (b1) as a host material is doped with a light-emitting material (a) as a guest material, i.e., a dopant.

As the light-emitting material (a), a laser dye material or the like may be used, which is used as a luminescent dye used in a light-emitting layer of a normal organic EL element.

As compared with the foregoing compound, the compound (b2) that is used in the light-emitting region of the foregoing type (B), that is capable of sustaining the charge transport, and that includes both of a portion for contributing to the charge transport and a portion for contributing to the light emission within the compound itself, does not require the use of the light-emitting material (a) in combination therewith, since the compound (b2) includes both of a portion for contributing to the light emission, and further, that is capable of sustaining the charge transport.

In both of the cases of the types (A) and (B), a light-emitting region preferably is formed with a film made of a mixture of the foregoing materials, which is formed by simultaneously depositing the foregoing materials composing the light-emitting region. Examples of the depositing method used herein include vapor deposition, electron beam (EB) vapor deposition, sputtering, and ion plating. In the case where these components are deposited, it is preferable to deposit the heavy metal component through a cracking means, particularly so that the heavy metal is dispersed and mixed in the light-emitting region in a state of particles that are as fine as possible, or more preferably, atomic-level heavy metal particles. Finer particles of the heavy material are more preferable since the light-emitting element is allowed to have a higher emission efficiency.

The layers of the light-emitting element of the present invention may comprise, as described above, a hole-injection electrode, a hole-transport layer, a light-emitting layer, and a cathode that are layered on a transparent substrate in the stated order. Further, a hole-injection layer may be provided as required between the hole-injection electrode and the hole-transport layer, an electron-transport layer may be provided as required between the light-emitting layer and the cathode, and an electron-injection layer may be provided as required on an interface of the cathode. Still further, in the present invention, a combination of the foregoing layers having respective functions is referred to as a light-emitting function layer, and a layer that actually emits light in the light-emitting function layer is referred to as a light-emitting region, as described above. The layer that conventionally has been referred to as "light-emitting layer" usually is included in the light-emitting region in the present invention.

As described above, in the present invention, a technique like that in a normal light-emitting element is applicable in which an appropriate transparent or opaque substrate is used and the foregoing element configuration described above is formed on the substrate. To get the emitted light out of the element, normally at least one of the paired electrodes is a transparent or at least semi-transparent electrode. In the case where the electrode on the substrate side is transparent or semi-transparent, it is normal that a transparent or semi-transparent substrate is used. In the case where an opaque substrate is used, the electrode provided on a side opposite to the substrate side is a transparent or semi-transparent electrode.

Anything may be used as the substrate as long as it is capable of carry a light-emitting element of the present invention thereon. In many cases, a glass substrate usually used in a thin film EL element is used, such as "Corning 1737" (a non-alkali borosilicate glass produced by Corning Glass Works). However, a resin film such as a polyester film may be used also.

The thickness of the substrate is not limited particularly, but it preferably is in a range of approximately 0.3 mm to 1.1 mm from the viewpoint of the strength and weight in the case where the substrate is a glass substrate. In the case where the substrate is a resin film substrate, the thickness preferably is in a range of approximately 50 μm to 1 mm.

The hole-injection electrode in the present invention may be any electrode as long as it is capable of functioning as an anode so as to inject holes in the element, and in many cases, the hole-injection electrode is a transparent electrode. In such a case, an indium tin oxide (ITO) film is used generally, which is formed by sputtering, electron beam vapor deposition, ion plating, etc. for improving the transparency thereof or reducing the resistivity thereof. The ITO film is in many cases subjected to various finishing treatments for controlling the resistivity and the shape thereof. The film thickness thereof is determined according to required sheet resistance and visible radiation transmissivity, but in an organic EL element, which has a relatively high driving current density, a film having a thickness of not less than 100 nm is often used so as to reduce the sheet resistance. Examples that can be used for forming the hole-injection electrode of the present invention include, in addition to these normal ITO films, various improved transparent conductive layers such as "IDIXO" (a transparent electrode material produced by Idemitsu Kosan Co., Ltd., which is made of indium oxide and a hexagonal layer compound made of indium zinc oxide, and is expressed by a molecular formula (general formula) of $In_2O_3(ZnO)_n$ (where n is an integer of not less than 3 without a particular upper limit, but generally it is not more than 100, preferably, not more than 10)). The examples also may include films obtained by coating a paint of a transparent conductive material in which a conductive powder is dispersed, or other electrodes may be used.

The light-emitting region in the present invention may be anything as long as it emits light under a condition of the co-presence with a heavy metal. Considering the characteristics as a single compound, examples used for forming the light-emitting region of the present invention include various materials in a wide range including various hole-transport light-emitting materials and electron-transport light-emitting materials, as well as compounds conventionally used for forming a light-emitting layer of an organic EL element. Among these, a material particularly preferably used is a compound that is capable of sustaining the charge transport, that includes both of a portion for contributing to the charge transport and a portion contributing to the light emission within the compound itself, and that excellently functions as a light-emitting layer even if the layer is made of the compound alone. A material of the foregoing group forms a single layer as a light-emitting region (light-emitting layer), or preferably a light-emitting function layer in combination with the hole-transport layer and the electron-transport layer, while it exhibits a notable tendency of significantly improving the emission efficiency when it is co-present with a heavy metal.

Particularly, when its molecular structure has a tetraphenylenediamine skeleton, a higher EL emission efficiency and a longer lifetime are achieved as compared with the triphenylamine dimer (such as TPD), which generically is called a $Q^1$-G-$Q^2$ structure. Further, since the foregoing molecular structure is asymmetric, molecules thereof hardly associate with one another, whereby crystallization or aggregation of the same hardly occur. Thus, an element with superior durability and long lifetime can be realized. More specifically, a phenyl group directly bonded with one of the nitrogen atoms of tetraphenylenediamine as a skeleton is substituted with a bulky group such as phenylstyryl, diphenylbutadienyl, anthryl, or the like, while a phenyl group directly bonded with the other nitrogen atom is either not substituted or substituted with an alkyl or alkoxy group and has a greater intermolecular interaction as compared with the other one, whereby the hole transport capability is improved. By using such a compound, it is possible to achieve not only a prolonged lifetime, but also an increased emission efficiency in the case where the compound forms a non-doped light-emitting layer made of the compound alone. As a reason for this, it is considered that when molecules tend to associate with one another, the concentration quenching due to interaction between portions contributing to the luminescent transition in each molecule is exhibited strongly. In particular, what was discovered by the present invention as a noticeable fact was that in the case of a compound of such a group, the co-presence with a heavy metal made it possible to achieve a further notably improved emission efficiency.

Still further, a compound whose molecular structure includes both of a portion for contributing to the luminescent transition and a portion for contributing to the hole transport within the compound is capable of sustaining sufficient charge transport and light emission at the same time, and a notable effect can be recognized.

Specific examples of the foregoing compound, that is, the compound (b2) used in the light-emitting region of the type (B), include

[4-(2,2-diphenylvinyl)phenyl][4-(diphenylamino)phenyl]phenylamine (abbreviated as "PPDA-PS"),

[4-(2,2-diphenylvinyl)phenyl](4-methoxyphenyl){4-[(4-methoxyphenyl)phenylamino]phenyl}amine (abbreviated as "M2PPDA-PS"), (4-{[4-(2,2-diphenylvinyl)phenyl](4-(9-anthryl)phenyl)amino}phenyl)diphenylamine (abbreviated as "PPDA-PS-A"), and (4-{[4-(2,2-diphenylvinyl)phenyl][4-(10-methoxy(9-anthryl))phenyl]amino}phenyl)diphenylamine (abbreviated as "PPDA-PS-AM").

In the case where such a compound (b2) is used, which is capable of sustaining the charge transport and that includes both of a portion for contributing to the charge transport and a portion for contributing to the light emission within the compound, a content of the heavy metal (c) in the light-emitting region preferably is in a range of 0.1 mol % to 50 mol %, or more preferably, in a range of 0.5 mol % to 20 mol % with respect to the compound (b2).

Still further, in the case where the light-emitting region is formed without using the above-described "compound that includes both of a portion for contributing to the charge transport and a portion for contributing to the light emission within the compound", a configuration of a mixture layer can be used in which the mixture layer is obtained by using a generally-used charge transport material as a host material, doping the same with a generally-used luminescent dye by vapor co-deposition, and further, making a heavy metal co-present. The above-mentioned light-emitting region of the configuration (A) that includes a light-emitting material (a), a compound (b1) capable of sustaining the charge transport, and a heavy metal (c) as a mixture corresponds to this configuration.

Here, examples of the generally-used charge-transport material, that is, the material equivalent to the compound (b1), include various hole-transport materials such as triphenylamine-based hole-transport materials like TPD and NPD described above, stilbene-based materials, and hydrazone-based materials. In addition to these, a variety of electron-transport materials including various metal complexes such as aluminum-quinolinol complexes, oxadiazole derivatives, and triazole derivatives can be used also. Furthermore, 4,4'-bis(carbazol-9-yl)biphenyl (abbreviated as "CBP") can be used suitably.

Still further, as the light-emitting material (a), various generally-used luminescent dyes can be used. For example, a variety of luminescent dyes such as coumarin derivatives, quinacridon derivatives, and phenoxazone derivatives can be used, or more widely, any one can be used as long as an emitted light with an intended wavelength can be obtained.

A ratio of the light-emitting material (a) and the compound (b1) capable of sustaining the charge transport preferably is (a):(b1)=1 mol:0.1 to 1000 mol, or more preferably, (a):(b1)=1 mol:1 to 500 mol.

A content of the heavy metal (c) in such a light-emitting region of the type (A) preferably is 0.1 mol % to 50 mol %, or more preferably, 0.5 mol % to 20 mol %, with respect to the light-emitting material (a).

As the heavy metal of the present invention, any one can be used as long as it contributes to increasing the probability of causing a triplet exciton that inherently makes a forbidden transition to make a luminescent transition to the ground state due to a so-called heavy metal effect. According to the studies herein, an effect was recognized notably in the case where the heavy metal was a metal with an atomic number of not less than 57. An upper limit to the atomic number of the heavy metal is not defined particularly, but generally, those with atomic numbers of not more than 85 are more easily handled. Among these, Ir, Au, and Pt are preferable.

As described above, to form the light-emitting region of the present invention, it is preferable to simultaneously deposit the above-described respective materials to form the light-emitting region by vapor co-deposition or the like so that the region is made of a mixture of these materials. As the deposition method, it is possible to use vapor deposition, electron beam (EB) vapor deposition, sputtering, ion-plating, etc. In the case where these components are deposited, it is preferable to deposit the same through a cracking means, particularly so that the heavy metal is dispersed and mixed in the light-emitting region in a state of as fine particles as possible, or more preferably, atomic-level heavy metal particles.

The heavy metal does not sufficiently contribute to the improvement of the emission efficiency if in the light-emitting region it is present in a so-called large-size cluster state in which a plurality of atoms of the metal compose an aggregation. Therefore, in the case where the heavy metal is deposited by vapor deposition or another depositing method of those described above, the heavy metal is used in a state of being cracked to as fine a particle as possible, even to an atomic level, whereby a high emission efficiency can be achieved. It is considered that ideally, the whole of the heavy metal is co-deposited in an atomic state. Therefore, the deposition preferably is carried out through a cracking means, for instance, by using an ion-plating device obtained by combining a normal EB vapor deposition device with a plasma cracker. In the light-emitting element of the present invention, to obtain preferable results, the size of the particles of the heavy metal preferably is reduced to be as small as possible with a view to improving the emission efficiency, for instance, so that atoms of the heavy metal included in one average cluster are not more than five on average, more preferably not more than three on average, further more preferably not more than 1.5 on average.

In the present element, as for the other layers, usual hole-injection layer, hole-transport layer, and electron-transport layer selected from wide ranges can be used. To form the hole-injection layer, a starburst amine derivative, an oligo amine derivative, or the like often is used for reducing the driving voltage by smoothing the roughness of the ITO surface, the improvement of the hole injection efficiency, and the like, as well as for lengthening the lifetime, and the layer sometimes is referred to as a buffer layer. To form the hole-transport layer, apart from the TPD or NPD described above, it is possible to use the same in combination with the technique in which a hole-transport material having a relatively great molecular weight and having a poor stereo structure, which therefore tends to cause association if it remains as it is, is blended with a hole-transport material having a relatively small molecular weight and having a stereo structure so that excellent characteristics are achieved.

Here, examples of the "hole-transport material having a relatively great molecular weight and having a poor stereo structure, which therefore tends to cause association if it remains as it is" include triphenylamine polymers such as N,N'-bis(4'-diphenylamino-4-biphenylyl)-N,N'-diphenyl-benzidine (abbreviated as "TPT"), and examples of the "hole-transport material having a relatively small molecular weight and having a stereo structure" include stilbene-based compounds such as 4-N,N-diphenylamino-α-phenylstilbene (abbreviated as "PS"). Additionally, various materials conventionally used in organic thin film EL elements also can be used for forming blend-type hole-transport layer.

To form the electron-transport layer, the metal complex-based materials that have been studied widely since Tang et al. used tris(8-quinolinolato)aluminum can be used, as well as oxadiazole derivatives, triazole derivatives, and other materials are applicable also.

To form the electron-injection electrode in the present invention, as in the prior art described above, it is possible to use an alloy of a metal that has a low work function and a low electron-injection barrier and a metal that has a relatively high work function and is stable, such as a MgAg alloy or an AlLi alloy proposed by Tang et al. Apart from that, any one of cathodes of various types that have been reported generally, for instance, a layered cathode of Li and Al, or a layered cathode of LiF and Al, can be used as the cathode.

It should be noted that the light-emitting element of the present invention is applicable in an information display device for displaying characters, marks, images, etc. in which a plurality of light-emitting elements are used, for instance, a flat-panel-type self-luminous display device, as an alternative to the LCD panel. Examples of such a display device include a device for displaying characters and marks, in which single-color light-emitting elements arranged in a matrix so that several or several tens of the same are arrayed in each of the vertical and horizontal directions form a unit for displaying one character, and several hundreds of the units in total are arranged in the vertical and horizontal directions, which means that several tens of thousands to several hundreds of thousands of light emitting elements are arranged in the whole display device. Examples of the same also include a color display device in which a pixel is composed of light-emitting elements of three colors of RGB (red, green, and blue), and the pixels are arranged in a matrix.

The inventions of the light-emitting elements of the above-described items (1), (6), (12), and (13) of the present invention have essential characteristics in that in the light-emitting element including at least a light-emitting region arranged between a pair of electrodes, the light-emitting region contains a compound capable of sustaining the charge transport (note: here, the combination of (a) and (b1) in the aforementioned type (A), and (b2) in the aforementioned type (B) generically are referred to as the compound capable of sustaining the charge transport) and a heavy metal as a mixture. By containing the compound that is capable of charge transport in a layer made of the same alone, the charge transport is continuously maintained, and the electron-hole recombination is maintained in the light-emitting region, surroundings of the same, and on an interface thereof. Further, by containing a heavy metal along with the foregoing compound, a triplet exciton that inherently makes a forbidden transition is allowed to make a luminescent transition from an excited state to a ground state due to a so-called heavy metal effect. This allows the triplet exciton that inherently does not contribute to light emission and that is generated at a considerably high rate to be used for light emission, whereby a significantly high emission efficiency can be achieved.

In the inventions of the light-emitting elements of the above-described items (2) and (7) of the present invention, the light-emitting region is made of a mixture of a compound capable of sustaining charge transport and a heavy metal, the mixture being obtained by simultaneously depositing the foregoing component materials composing the light-emitting region. Thus, by containing the compound that is capable of sustaining the charge transport in a layer made of the same alone, the charge transport is continuously maintained, and the electron-hole recombination is maintained in the light-emitting region, surroundings of the same, and on an interface thereof. Further, by simultaneously depositing a heavy metal along with the foregoing compound so as to form a layer of the mixture of the materials, a triplet exciton that inherently makes a forbidden transition is allowed to make a luminescent transition from an excited state to a ground state due to a so-called heavy metal effect. This allows the triplet exciton that inherently does not contribute to light emission and that is generated at a considerably high rate to be used for light emission, whereby a significantly high emission efficiency can be achieved.

Particularly, in the case where, as in the items (6) and (7) described above, the compound (b2) that includes a portion for contributing to the charge transport and a portion for contributing to the light emission in the compound is used as the compound capable of sustaining the charge transport is used in the light-emitting element of the present invention, it is possible to sustain sufficient charge transport and light emission at the same time. This is preferable since a more notably high emission efficiency can be achieved.

As in the item (8) described above, the light-emitting element of the present invention may be configured so that the compound capable of sustaining the charge transport in the item (6) or (7) is a hole-transport light-emitting material. By so doing, it is possible to sustain sufficient charge transport and light emission at the same time. This is preferable since a more notably high emission efficiency can be achieved.

As in the items (3) and (9) described above, the light-emitting element of the present invention may be configured so that a content of the heavy metal in the light-emitting region is in a range of 0.1 mol % to 50 mol % with respect to the light-emitting material in the case of the item (3), or so that a content of the heavy metal in the light-emitting region is in a range of 0.1 mol % to 50 mol % with respect to the compound that is capable of sustaining charge transport and that includes both of a portion for contributing charge transport and a portion for contributing to light emission within the compound, in the case of the item (9). By so doing, it is possible to sustain sufficient charge transport and light emission at the same time. This is preferable since a more notably high emission efficiency can be achieved.

The inventions of the above-described items (16), (21), and (26) have essential characteristics in that the heavy metal is a metal with an atomic number of not less than 57. This is preferable since the co-presence of a heavy metal with an atomic number of not less than 57 with a compound makes it possible to achieve a high emission efficiency, even if the compound is a compound other than light-emitting materials that normally emit intense fluorescence or phosphorescence, for instance a compound capable of sustaining the charge transport or a compounds that includes a portion for contributing to the charge transport and a portion for contributing to the light emission.

In the inventions of the above-described items (4), (5), (10), (11), (14), (16), (24), and (25), the heavy metal mixed is present in a state of particles as fine as possible in the light-emitting region, for instance, in an ultrafine particle state that is selected from an atomic particle state and cluster particle states in which each cluster particle has not more than ten atoms of the heavy metal on average, or preferably in an ultrafine particle state that is selected from an atomic particle state and cluster particle states in which each cluster particle has not more than five atoms of the heavy metal on average. This is preferable since it improves the emission efficiency.

The following will describe the present invention in more detail while referring to specific examples thereof, but the present invention is not limited to these specific examples. It should be noted that respective light-emitting materials, other than compounds whose manufacturers are shown specifically, were synthesized by usual methods as shown in synthesis examples herein, and were used after being purified sufficiently.

EXAMPLE 1

Figure 1:
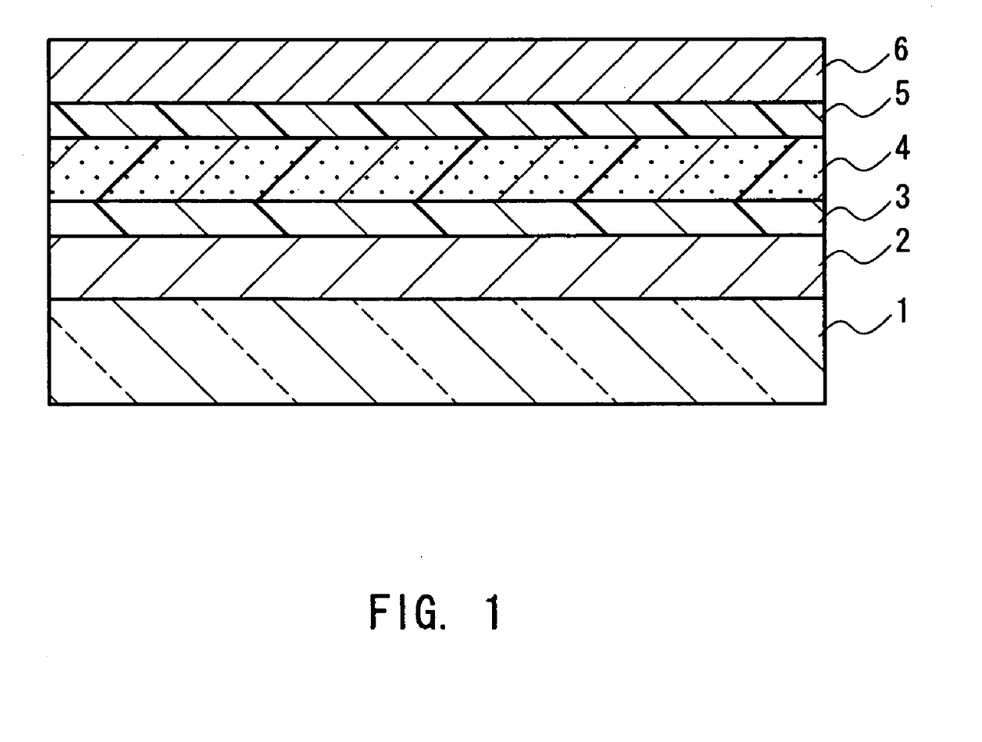
FIG. 1 is a schematic cross-sectional view of an embodiment of an organic thin film electroluminescent element as a light-emitting element of the present invention.

FIG. 1 is a schematic cross-sectional view illustrating an organic thin film electroluminescent element as a light-emitting element of the present invention. In FIG. 1, 1 denotes a transparent substrate. 2 denotes a hole-injection electrode. 3 denotes a hole-transport layer. 4 denotes a hole-transport light-emitting layer that corresponds to a light-emitting region in the present invention, that contains a compound capable of sustaining the charge transport and a heavy metal so that the heavy metal is co-present as a mixed material. 5 denotes an electron-transport layer. 6 denotes a cathode. Light-emitting elements of the other examples are substantially similar to this embodiment, but the present invention is not limited to the embodiment shown in the drawing.

The following describes the light-emitting element of the foregoing embodiment in more detail. A commercially-available ITO-applied glass substrate (produced by Sanyo Vacuum Industries Co., Ltd., size: 100 mm×100 mm×0.7 mm (thickness), sheet resistance: approximately 14 Ω/□), was used as the substrate obtained by forming the hole-injection electrode 2 on the transparent substrate 1, and it was patterned by photolithography so as to have a light-emitting area of portions overlapped with electron-injection electrodes of 1.4 mm×1.4 mm. Through a treatment applied to the substrate after the patterning by photolithography, a resist was removed by immersing the substrate in a commercially-available resist remover (a solution of a mixture of dimethyl sulfoxide and N-methyl-2-pyrolidone), and thereafter, the substrate was rinsed with acetone, and was immersed in fuming nitric acid for one minute so that the resist was removed completely. The washing of the ITO surface was carried out sufficiently on both of front and back sides of the substrate, by carrying out mechanical abrasion washing with a nylon brush while sufficiently supplying a 0.238 percent by weight (wt %) aqueous solution of tetramethyl ammonium hydroxide. Thereafter, the substrate was rinsed sufficiently with pure water, and was subjected to spin drying. Then, the substrate was subjected to oxygen plasma treatment for one minute in a commercially available plasma reactor ("PR41 type" produced by Yamato Scientific Co., Ltd.) under conditions of an oxygen flow rate of 20 sccm, a pressure of 26.66 Pa (0.2 Torr), and a high frequency output of 300 W.

The substrate with the hole-injection electrode thus prepared was arranged in a vacuum chamber. As a vapor deposition device, a commercially available high-vacuum vapor deposition device ("EBV-6DA type" produced by ULVAC Inc.) was modified and used. It had, as a main exhausting device, a turbo molecular pump of a pumping speed of 1500 liter/min ("TC1500" produced by Osaka Vacuum, Ltd.), and achieved a degree of vacuum of not more than approximately $133.3 \times 10^{-6}$ Pa (approximately $1 \times 10^{-6}$ Torr). All the vapor deposition operations were carried out in a range of 266.6 to $399.9 \times 10^{-6}$ Pa (2 to $3 \times 10^{-6}$ Torr). As to all of the organic compounds, the vapor deposition operations were carried out by connecting a direct current source ("PAK10-70A" produced by Kikusui Electronic Corp.) with a resistance-heating vapor deposition boat made of tungsten, and the vapor deposition of a heavy metal was carried out using an ion plating device produced by combining a commercially-available electron beam (EB) vapor deposition source with a plasma cracker.

To form the hole-transport layer 3 on the substrate with the hole-injection electrode thus arranged in the vacuum chamber, N,N'-bis(4'-diphenylamino-4-biphenylyl)-N,N'-diphenylbenzidine (abbreviated as "TPT", produced by Hodogaya Chemical Co., Ltd.) and 4-N,N-diphenylamino-α-phenylstilbene (abbreviated as "PS") were co-deposited through vapor deposition at vapor deposition rates of 0.3 (nm/sec) and 0.01 (nm/sec), respectively, whereby a blend-type hole-transport layer 3 was formed with a thickness of approximately 80 nm.

Next, to form a hole-transport light-emitting layer corresponding to the light-emitting region 4 of the present invention, [4-(2,2-diphenylvinyl)phenyl][4-(diphenylamino)phenyl] phenylamine (abbreviated as "PPDA-PS") and Ir were deposited at vapor deposition rates of 0.3 nm/sec and 0.01 nm/sec, respectively, so as to have a thickness of approximately 40 nm. Most of Ir dispersed and mixed in the light-emitting region was dispersed and mixed as Ir in a single atom state.

Here, [4-(2,2-diphenylvinyl)phenyl][4-(diphenylamino)phenyl] phenylamine (abbreviated as "PPDA-PS") was obtained by synthesis as follows.

41.4 g of N,N'-diphenyl-p-phenylenediamine, 66 g of iodobenzene, 100 ml of nitrobenzene, 45 g of $K_2CO_3$, 10.8 g of copper powder, and $I_2$ (trace) were put in a four-neck flask of 300-milliliter volume, and were refluxed gently over 24 hours by stirring the same while removing generated water by reflux. Subsequently, steam distillation was carried out, and when a distillate no longer came out, residues were filtered out after cooling, washed with water, and extracted using toluene. After removing toluene by distillation, ethanol was added to the residues, and the mixture was filtered. Recrystallization was carried out using a solvent of toluene and ethanol (toluene:ethanol=4:1 (by volume)), whereby 36.5 g of N,N,N',N'-tetraphenyl-p-phenylenediamine was obtained. It had a melting point of 200° C. to 202° C.

Subsequently, 24 g (14 ml) of $POCl_3$ was dropped to a mixture of 24 g of N-methylformanilide and 20 ml of o-dichlorobenzene in a four-neck flask of 200-milliliter volume at 25° C. over 1 hour. Next, 36 g of N,N,N',N'-tetraphenyl-p-phenylenediamine obtained as above was added thereto, and the mixture was stirred further for 2 hours at 90° C. to 95° C. (since it was hardened midway, 30 ml of o-dichlorobenzene was added). The mixture was cooled after reaction, poured into 70 ml of $H_2SO_4$ with a concentration of 10 percent by volume (vol %), and was extracted using toluene. The toluene solution thus obtained was washed with water, a 5 vol %-concentration $Na_2CO_3$ aqueous solution, and water successively in this order, and was desiccated using $Na_2SO_4$. A product obtained after removing toluene by distillation was dissolved in a small amount of toluene, and silica column chromatography was carried out. 25.8 g of yellow-color crystal, which is p-(N-phenyl-N-p'-N',N'-diphenylaminophenyl)aminobenzaldehyde, was obtained. It had a melting point of 136° C. to 138° C.

Subsequently, in a three-neck flask of 200 milliliter volume, 8 g of diethyl-1,1-diphenyl methyl phosphonate, and 13.3 g of p-(N-phenyl-N-p'-N',N'-diphenylaminophenyl) aminobenzaldehyde obtained as above were dissolved in 80 ml of desiccated N,N-dimethyl formamide (DMF), and 3.5 g of potassium t-butoxide (t-BuOK) was added over 30 minutes at 21° C. to 33° C. This was followed by stirring for 3.5 hours at 20° C. to 25° C. Next, the solution was added to 300 ml of water with ice while stirring. The toluene extraction and the washing with water were carried out, and after removing toluene by distillation, alumina column chromatography was carried out using a toluene solvent. As a result, 0.9 g of [4-(2,2-diphenylvinyl)phenyl][4-(diphenylamino)phenyl]phenylamine (abbreviated as "PPDA-PS") was obtained. Here, mp was 218° C. to 219° C.

Next, to form the electron-transport layer 5, tris(8-quinolinolato)aluminum (abbreviated as "Alq3", produced by Dojindo Laboratories) was deposited at a vapor deposition rate of 0.3 nm/sec so as to have a thickness of approximately 20 nm.

Subsequently, to form the cathode 6, from an AlLi alloy (produced by Kojundo Chemical Laboratory Co., Ltd., Al/Li ratio by weight: 99/1), only Li was deposited at a low temperature at a vapor deposition rate of approximately 0.1 nm/s so as to have a thickness of approximately 1 nm. Then, the AlLi alloy was heated to a higher temperature so that the leaving of Li from the AlLi alloy stopped, and in this state, only Al was deposited at a vapor deposition rate of approximately 1.5 nm/sec so as to have a thickness of approximately 100 nm. Thus, a layered cathode was obtained.

After the vacuum chamber was filled with desiccated nitrogen, a lid made of "Corning 7059 glass" (a non-alkali borosilicate glass produced by Corning Glass Works) was attached to the thin film EL element thus produced, using an adhesive (Trade Name: "Super Vac Seal 953-7000", produced by ANELVA Corporation) in the desiccated nitrogen atmosphere, so that the element became unsusceptible to an external atmosphere. Thus a sample of the thin film EL element was obtained.

The thin film EL element sample thus obtained was subjected to the following evaluating operations.

The evaluation at an initial stage was made in a normal laboratory environment of normal temperature and normal moisture when 12 hours elapsed after the attachment of the glass lid after the element was obtained by vapor deposition, so as to determine the emission efficiency (cd/A), and the driving voltage for the emission of 1000 (cd/m$^2$). Additionally, a continuous emission test was carried out with a current value that caused an initial luminance to be 1000 (cd/m$^2$), by the constant DC driving, in a normal laboratory environment of normal temperature and normal moisture. According to this test, a time when the luminance decreased to half (to 500 cd/m$^2$) was determined as a lifetime.

A constant direct current supply (Trade Name: "Multichannel Current Voltage Controller TR-6163", produced by ADVANTEST Corporation) was used as a DC driving power source, so that voltage/current characteristics were measured. The luminance was measured using a luminance meter (Trade Name: "TOPCON Luminance Meter BM-8", produced by TOPCON Corporation). Emission image qualities such as luminance irregularities, black points (non-emission portions), etc. were observed using an optical microscope with a magnification of 50 times.

The pulse driving was carried out by a self-made constant current pulse driving circuit, and the evaluation was made by setting the pulse frequency to 100 Hz (10 ms), the duty to 1/240 (pulse amplitude: 42 μs), and the pulse waveform to a square waveform, while setting the pulse current to various values. The luminance was measured using the luminance meter (Trade Name: "TOPCON Luminance Meter BM-8", produced by TOPCON Corporation), and a pulse driving voltage that caused an average luminance to become 270 (cd/m$^2$). The continuous emission test was carried out by continuous pulse driving in a normal laboratory environment of normal temperature and normal moisture with a pulse voltage that caused an initial luminance to be 270 (cd/m$^2$). According to this test, a time when the luminance decreased to half (to 135 cd/m$^2$) was determined.

As to the states of the heavy metal particles mixed in the light-emitting region such as the size of a cluster of the heavy metal mixed in the light-emitting region, that is, the number of atoms of the heavy metal contained in the cluster, whether the heavy metal is dispersed and mixed in a single atom state, etc., the transmission electron microscope observation, which is often used in a normal thin film analysis, was carried out after the film formation of the light-emitting region, whereby the states of atoms of the heavy metal were observed.

The evaluation results are shown in Table 1.

According to the present example, a thin film EL element was obtained that had a high emission efficiency, that achieved light emission with excellent visibility by self generation at a low driving voltage, that underwent a small decrease in the luminance even in the continuous emission test, that did not have defects such as black points or luminance irregularities, and that could be used stably for a significantly long period of time.

In particular, a thin film EL element was obtained that, even during the pulse driving corresponding to the actual driving in a panel, was driven at a high efficiency with a low driving voltage, that underwent a small decrease in the luminance even in the continuous emission test, that did not have defects such as black points or luminance irregularities, and that could be used stably for a significantly long period of time.

EXAMPLE 2

A thin film EL element sample was produced in the same manner as that of Example 1 except that in forming the hole-transport light-emitting layer of Example 1, [4-(2,2-diphenylvinyl)phenyl](4-methoxyphenyl){4-[(4-methoxyphenyl)phenylamino]phenyl}amine (abbreviated as "M2PPDA-PS") was used in place of [4-(2,2-diphenylvinyl)phenyl][4-(diphenylamino)phenyl]phenylamine (PPDA-PS).

Here, [4-(2,2-diphenylvinyl)phenyl](4-methoxyphenyl){4-[(4-methoxyphenyl)phenylamino]phenyl}amine (M2PPDA-PS) was obtained by synthesis as follows.

27.6 g of N,N'-diphenyl-p-phenylenediamine, 50 g of p-iodoanisole, 75 ml of nitrobenzene, 30 g of K$_2$CO$_3$, 7.2 g of copper powder, and I$_2$ (trace) were put in a four-neck flask of 300-milliliter volume, and were refluxed gently over 24 hours by stirring the same while removing generated water by distillation. Subsequently, steam distillation was carried out, and when a distillate no longer came out, residues were extracted using toluene after cooling. After removing toluene by distillation, residues were subjected to alumina column chromatography using a toluene solvent. After removing toluene by distillation, recrystallization of the residues was carried out using a solvent of toluene and ethanol (toluene:ethanol=1:3 by volume), whereby 35.3 g of N,N'-diphenyl-N,N'-bis(p-methoxyphenyl)-p-phenylenediamine was obtained. It had a melting point of 132° C. to 134° C.

Subsequently, 20.4 g of POCl$_3$ (12 ml) was dropped to a mixture of 20.4 g of N-methylformanilide and 17 ml of o-dichlorobenzene in a four-neck flask of 200-milliliter volume over 1 hour at 25° C. Next, 35 g of N,N'-diphenyl-N,N'-bis(p-methoxyphenyl)-p-phenylenediamine obtained as above was added thereto, and the mixture was stirred further for 2 hours at 90° C. to 95° C. The mixture was cooled after reaction. The reaction solution was poured into 70 ml of 10 vol %-concentration H$_2$SO$_4$, and was extracted using toluene. The toluene solution thus obtained was washed with water, a 5 vol %-concentration Na$_2$CO$_3$ aqueous solution, and water successively in this order, and was desiccated using Na$_2$SO$_4$. A product obtained after removing toluene by distillation was subjected to silica column chromatography using a toluene solvent. After toluene was removed by distillation, residues were recrystallized using ethanol. 16.9 g of orange-color crystal, which is p-[N-(p-methoxyphenyl)-N-{p-N'-phenyl-N'-(p-methoxyphenyl)aminophenyl}]-aminobenzaldehyde, was obtained. It had a melting point of 160° C. to 161° C.

Subsequently, in a three-neck flask of 200 milliliter volume, 9.9 g of diethyl-1,1-diphenyl methyl phosphonate, and 16.4 g of p-[N-(p-methoxyphenyl)-N-{p-N'-phenyl-N'-(p-methoxyphenyl)aminophenyl}]-aminobenzoaldehyde obtained as above were dissolved in 65 ml of desiccated DMF, and 4.4 g of t-BuOK was added over 30 minutes at 21° C. to 33° C. This was followed by stirring for 3.5 hours at 20° C. to 25° C. Next, the solution was poured to 300 ml of water with ice while stirring. The toluene extraction and the washing with water were carried out, and after removing toluene by distillation, alumina column chromatography was carried out using a toluene solvent. As a result, 0.7 g of [4-(2,2-diphenylvinyl)phenyl](4-methoxyphenyl){4-[(4-methoxyphenyl)phenylamino]phenyl}amine (M2PPDA-PS) was obtained. It had a melting point of 271° C. to 272° C.

A thin film EL element sample was produced in the same manner as that of Example 1 except that the thus synthesized material was used as a hole-transport light-emitting material, and was co-deposited together with Ir in the same manner as that of Example 1 so as to form the hole-transport light-emitting layer as a light-emitting region of the present invention, and the evaluating operations as those of Example 1 described above were carried out. It should be noted that most of Ir that was dispersed and mixed in the light-emitting region was dispersed and mixed as Ir in a single atom state.

The evaluation results are shown in Table 1.

EXAMPLE 3

A thin film EL element sample was produced in the same manner as that of Example 1 except that in forming the hole-transport light-emitting layer of Example 1,
(4-{[4-(2,2-diphenylvinyl)phenyl](4-(9-anthryl)phenyl)amino}phenyl)diphenylamine (abbreviated as "PPDA-PS-A") was used in place of
[4-(2,2-diphenylvinyl)phenyl][4-(diphenylamino)phenyl]phenylamine (PPDA-PS), and it was co-deposited together with Ir in the same manner as that of Example 1. The same evaluating operations were carried out as those in Example 1 described above. The evaluation results are shown in Table 1.

Here,
(4-{[4-(2,2-diphenylvinyl)phenyl](4-(9-anthryl)phenyl)amino}phenyl)diphenylamine (PPDA-PS-A) was obtained by synthesis as follows.

After carrying out an Ullmann reaction of N-acetyl-1,4-phenylenediamine as a starting material with iodobenzene, a reaction product was subjected to hydrolysis, and further subjected to an Ullmann reaction with 9-(4-iodophenyl)anthracene, so that 4-(anthracen-9-yl)phenyl-triphenyl-phenylenediamine was obtained.

Figure 2:
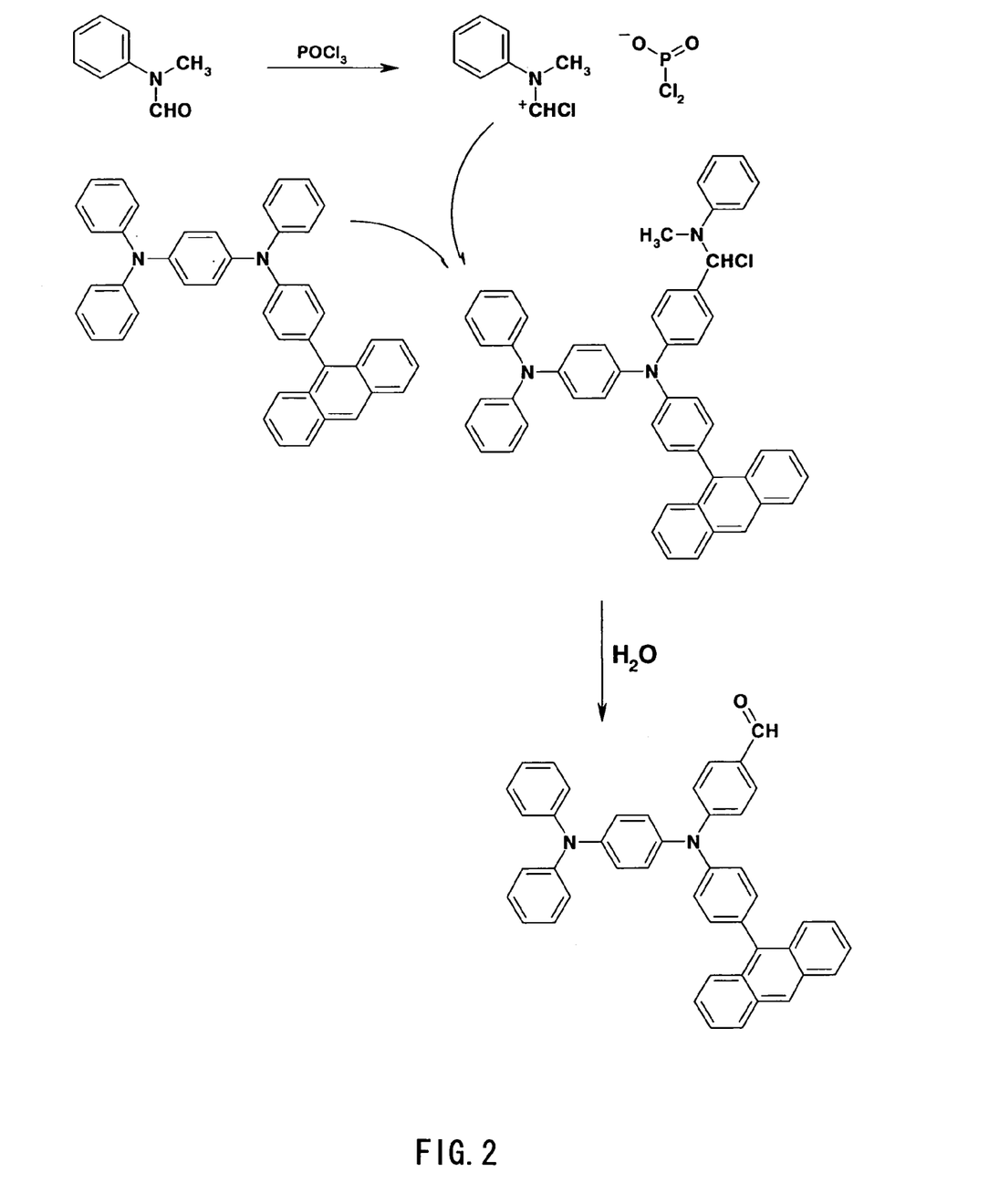
FIG. 2 is a view of a reaction formula indicating the formylation of 4-(anthracen-9-yl)phenyl-triphenyl-phenylenediamine as a result of a Vilsmeier reaction.

Further, the formylation as indicated by the reaction formula shown in FIG. 2 was performed using a Vilsmeier reaction. It should be noted that FIG. 2 is a reaction formula indicating the formylation of 4-(anthracen-9-yl)phenyl-triphenyl-phenylenediamine through a Vilsmeier reaction. Many cases in which dimethyl formamide (DMF) was used to achieve a high reactivity in the formylation have been reported, but in order to improve the reaction selectivity so as to increase a ratio of a target substance to be obtained, N-methylformanilide was used. Since the Vilsmeier reaction is an electrophilic addition reaction, a position C having the highest HOMO (highest occupied molecular orbital) electron density becomes a reaction position, and a position p of a benzene ring that is bonded with N directly is formylated. A target substance was extracted through sufficient isolation by column development.

Finally, diphenyl bromomethane and diethyl diphenylmethylphosphonate obtained from ethyl phosphate were used in a final reaction after they were distilled under reduced pressure, and a diphenylvinyl group was reacted with a formylated portion, as described above. A compound thus obtained further was subjected to sufficient isolation by column development, and was purified by sublimation sufficiently, before it was used in the light-emitting element production.

Since it is considered that generally a vinyl bond is not resistant to high temperature in the Ullmann reaction, a synthesis example described above was such that preliminarily a skeleton was obtained by the Ullmann reaction and thereafter the formylation was carried out by the Vilsmeier reaction, and finally the diphenylvinyl group was added. However, another method is available in which a Pd catalyst or the like is used and the coupling with the anthracene portion is carried out at the last stage, whereby the compound can be obtained at a higher yield. In this case, the same results were obtained regarding the light-emitting element characteristics.

Further, most of Ir dispersed and mixed in the light-emitting region was dispersed and mixed as Ir in a single atom state.

EXAMPLE 4

A thin film EL element sample was produced in the same manner as that of Example 1 except that in forming the hole-transport light-emitting layer of Example 1,
(4-{[4-(2,2-diphenylvinyl)phenyl][4-(10-methoxy(9-anthryl))phenyl]amino}phenyl)diphenylamine (abbreviated as "PPDA-PS-AM") was used in place of [4-(2,2-diphenylvinyl)phenyl][4-(diphenylamino)phenyl]phenylamine (PPDA-PS), and it was co-deposited together with Ir in the same manner as that of Example 1 described above. The same evaluating operations were carried out as those in Example 1 described above. The evaluation results are shown in Table 1.

Here,
(4-{[4-(2,2-diphenylvinyl)phenyl][4-(10-methoxy(9-anthryl))phenyl]amino}phenyl)diphenylamine (PPDA-PS-AM) was obtained by synthesis as follows.

The same synthesis as that in Example 3 was carried out except that 10-(4-iodophenyl)-9-methoxyanthracene was used in place of 9-(4-iodophenyl)anthracene used in Example 3. As the method for obtaining the compound, in addition to the above-described synthesis, another method is available in which a Pd catalyst or the like is used and the coupling with the anthracene portion is carried out at the last stage, whereby the compound can be obtained at a higher yield. In this case also, the same results were obtained regarding the light-emitting element characteristics.

Further, most of Ir dispersed and mixed in the light-emitting region was dispersed and mixed as Ir in a single atom state.

EXAMPLE 5

A thin film EL element sample was produced in the same manner as that of Example 1 except that in forming the hole-transport light-emitting layer of Example 3, Pt was used in place of Ir. The same evaluating operations were carried out as those in Example 1 described above. It should be noted that most of Pt dispersed and mixed in the light-emitting region was dispersed and mixed as Pt in a single atom state.

The results are shown in Table 1.

EXAMPLE 6

A thin film EL element sample was produced in the same manner as that of Example 1 except that in forming the hole-transport light-emitting layer of Example 3, Au was used in place of Ir. The same evaluating operations were carried out as those in Example 1 described above. It should be noted that most of Au dispersed and mixed in the light-emitting region was dispersed and mixed as Au in a single atom state.

The results are shown in Table 1.

EXAMPLE 7

A thin film EL element sample was produced in the same manner as that of Example 1 except that in forming the hole-transport light-emitting layer of Example 3, La was used in place of Ir. The same evaluating operations were carried out as those in Example 1 described above. It should be noted that most of La dispersed and mixed in the light-emitting region was dispersed and mixed as La in a single atom state.

The results are shown in Table 1.

EXAMPLE 8

A thin film EL element sample was produced in the same manner as that of Example 1 except that in forming the hole-transport light-emitting layer of Example 3, Tb was used in place of Ir. The same evaluating operations were carried out as those in Example 1 described above. It should be noted that most of Tb dispersed and mixed in the light-emitting region was dispersed and mixed as Th in a single atom state.

The results are shown in Table 1.

EXAMPLE 9

A thin film EL element sample was produced in the same manner as that of Example 1 except that the formation of the hole-transport light-emitting layer of Example 1 was carried out as follows, and the same evaluating operations were carried out as those in Example 1 described above.

The results are shown in Table 1.

Here, the hole-transport light-emitting layer corresponding to the light-emitting region of the present invention was formed in the following manner.

4,4'-bis(carbazol-9-yl)biphenyl (abbreviated as "CBP", produced by Chemipro Kasei Kaisha, Ltd.) as a compound capable of sustaining the charge transport, [2-methyl-6-[2-(2,3,6,7-tetrahydro-1H,5H-benzo[ij]quinolizin-9-yl)ethernyl]-4H-pyran-4-ylidene]propene-dinitrile (abbreviated as "DCM2", produced by Kodak Co., Ltd.) as a light-emitting material, and Ir were deposited at vapor deposition rates of 0.3 nm/sec, 0.01 nm/sec, and 0.01 nm/sec, respectively, so as to form a film with a thickness of approximately 40 nm. The vapor deposition of Ir was performed using an ion plating device produced by combining an electron beam (EB) vapor deposition source with a plasma cracker, as in Example 1.

It should be noted that most of Ir dispersed and mixed in the light-emitting region was dispersed and mixed as Ir in a single atom state.

COMPARATIVE EXAMPLE 1

A thin film EL element sample was produced in the same manner as that of Example 1 except that in forming the hole-transport light-emitting layer of Example 1, only [4-(2,2-diphenylvinyl)phenyl][4-(diphenylamino)phenyl] phenylamine (PPDA-PS) was used, without co-depositing Ir. The same evaluating operations were carried out as those in Example 1 described above.

The evaluation results are shown in Table 1.

COMPARATIVE EXAMPLE 2

A thin film EL element sample was produced in the same manner as that of Example 2 except that in forming the hole-transport light-emitting layer of Example 2, only [4-(2,2-diphenylvinyl)phenyl](4-methoxyphenyl){4-[(4-methoxyphenyl)phenylamino]phenyl}amine (M2PPDA-PS) was used, without co-depositing Ir. The same evaluating operations were carried out as those in Example 1 described above.

The evaluation results are shown in Table 1.

COMPARATIVE EXAMPLE 3

A thin film EL element sample was produced in the same manner as that of Example 1 except that in forming the hole-transport light-emitting layer of Example 1, Ba was used in place of Ir so as to be co-deposited together with [4-(2,2-diphenylvinyl)phenyl][4-(diphenylamino)phenyl] phenylamine (PPDA-PS). The same evaluating operations were carried out as those in Example 1 described above. The evaluation results are shown in Table 1.

It should be noted that most of Ba dispersed and mixed in the light-emitting region was dispersed and mixed as Ba in a single atom state.

COMPARATIVE EXAMPLE 4

A thin film EL element sample was produced in the same manner as that of Example 2 except that in forming the hole-transport light-emitting layer of Example 2, Ba was used in place of Ir so as to be co-deposited together with [4-(2,2-diphenylvinyl)phenyl](4-methoxyphenyl){4-[(4-methoxyphenyl)phenylamino]phenyl}amine (M2PPDA-PS) in the same manner as that of Example 2. The same evaluating operations were carried out as those in Example 1 described above. The evaluation results are shown in Table 1.

It should be noted that most of Ba dispersed and mixed in the light-emitting region was dispersed and mixed as Ba in a single atom state.

COMPARATIVE EXAMPLE 5

A thin film EL element sample was produced in the same manner as that of Example 9 except that in forming the hole-transport light-emitting layer of Example 9, only 4,4'-bis(carbazol-9-yl)biphenyl (CBP, produced by Chemipro Kasei Kaisha, Ltd.), and
[2-methyl-6-[2-(2,3,6,7-tetrahydro-1H,5H-benzo[ij]quinolizin-9-yl)ethernyl]-4H-pyran-4-ylidene]propene-dinitrile (DCM2, produced by Kodak Co., Ltd.) were used, without co-depositing Ir. The same evaluating operations were carried out as those in Example 1 described above. The evaluation results are shown in Table 1.

(4-{[4-(2,2-diphenylvinyl)phenyl][4-(10-methoxy(9-anthryl))phenyl]amino}phenyl)diphenylamine.
Alq3 represents tris(8-quinolinolato)aluminum.
CBP represents 4,4'-bis(carbazol-9-yl)biphenyl.
DCM2 represents
[2-methyl-6-[2-(2,3,6,7-tetrahydro-1H,5H-benzo[ij]quinolizin-9-yl)ethernyl]-4H-pyran-4-ylidene]propene-dinitrile.
Al represents aluminum.
Li represents lithium.
Ir represents iridium.
Pt represents platinum.
Au represents gold.

TABLE 1

| | | Evaluation Results | | | | | |
| | | DC Constant Current Driving | | | Pulse Constant Current Driving | | | |
| | Sample | Emission | Driving | Lifetime (Time till Luminance decreases | Emission | Driving | Lifetime (Time till Luminance decreases | Others (Luminance |
| Sample Number | Contents | Efficiency (cd/A) | Voltage (V) | to half) (hr) | Efficiency (cd/A) | Voltage (V) | to half) (hr) | Irregularities, etc.) |
|---|---|---|---|---|---|---|---|---|
| Ex. 1 | ITO/TPT + PS(80)/PPDA – PS + Ir(40)/ Alq3(20)/Li/Al | 18.4 | 8.0 | 2500 | 18.2 | 9.9 | 2100 | Excellent |
| Ex. 2 | ITO/TPT + PS(80)/M2PPDA – PS + Ir(40)/ Alq3(20)/Li/Al | 19.6 | 7.9 | 2700 | 19.3 | 10.1 | 2200 | Excellent |
| Ex. 3 | ITO/TPT + PS(80)/PPDA – PS – A + Ir(40)/ Alq3(20)/Li/Al | 29.4 | 6.1 | 3100 | 25.1 | 8.2 | 2500 | Excellent |
| Ex. 4 | ITO/TPT + PS(80)/PPDA – PS – AM + Ir(40)/ Alq3(20)/Li/Al | 28.7 | 5.9 | 3300 | 26.3 | 8.0 | 2600 | Excellent |
| Ex. 5 | ITO/TPT + PS(80)/PPDA – PS – A + Pt(40)/ Alq3(20)/Li/Al | 29.4 | 6.1 | 3100 | 25.1 | 8.2 | 2500 | Excellent |
| Ex. 6 | ITO/TPT + PS(80)/PPDA – PS – A + Au(40)/ Alq3(20)/Li/Al | 30.4 | 6.1 | 3100 | 25.1 | 8.2 | 2500 | Excellent |
| Ex. 7 | ITO/TPT + PS(80)/PPDA – PS – A + La(40)/ Alq3(20)/Li/Al | 29.4 | 6.1 | 3100 | 25.1 | 8.2 | 2500 | Excellent |
| Ex. 8 | ITO/TPT + PS(80)/PPDA – PS – A + Tb(40)/ Alq3(20)/Li/Al | 30.4 | 6.1 | 3100 | 25.1 | 8.2 | 2500 | Excellent |
| Ex. 9 | ITO/TPT + PS(80)/CBP + DCM2 + Ir(40)/ Alq3(20)/Li/Al | 6.4 | 7.2 | 2100 | 5.9 | 9.7 | 1900 | Excellent |
| Comp. Ex. 1 | ITO/TPT + PS(80)/PPDA – PS(40)/ Alq3(20)/Li/Al | 8.4 | 8.0 | 2500 | 8.2 | 9.9 | 2100 | Excellent |
| Comp. Ex. 2 | ITO/TPT + PS(80)/M2PPDA – PS(40)/ Alq3(20)/Li/Al | 9.6 | 7.9 | 2700 | 9.3 | 10.1 | 2200 | Excellent |
| Comp. Ex. 3 | ITO/TPT + PS(80)/PPDA – PS + Ba(40)/ Alq3(20)/Li/Al | 8.2 | 8.8 | 2000 | 7.9 | 10.6 | 1100 | Excellent |
| Comp. Ex. 4 | ITO/TPT + PS(80)/M2PPDA – PS + Ba(40)/ Alq3(20)/Li/Al | 9.1 | 8.4 | 1900 | 9.0 | 12.1 | 1500 | Excellent |
| Comp. Ex. 5 | ITO/TPT + PS(80)/CBP + DCM2(40)/ Alq3(20)/Li/Al | 2.1 | 7.9 | 1500 | 1.8 | 10.2 | 1200 | Excellent |

In Table 1, the element configurations of Examples of Comparative Examples are described with abbreviations.
TPT represents
N,N'-bis(4'-diphenylamino-4-biphenylyl)-N,N'-diphenylbenzidine.
PS represents 4-N,N-diphenylamino-α-phenylstilbene.
PPDA-PS represents
[4-(2,2-diphenylvinyl)phenyl][4-(diphenylamino)phenyl]phenylamine.
M2PPDA-PS represents
[4-(2,2-diphenylvinyl)phenyl](4-methoxyphenyl){4-[(4-methoxyphenyl)phenylamino]phenyl}amine.
PPDA-PS-A represents
(4-{[4-(2,2-diphenylvinyl)phenyl](4-(9-anthryl)phenyl)amino}phenyl)diphenylamine.
PPDA-PS-AM represents La represents lanthanum.
Tb represents terbium.
Ba represents barium.

The components constituting each layered configuration in an order from the ITO electrode side are thus described with the abbreviations from left, with slashes "/" being interposed therebetween. Numerical figures in brackets "( )" indicate film thicknesses by nanometer, and "+" indicates that the film in which the components described on both sides of the foregoing mark were co-present was formed by doping mixture or the like.

INDUSTRIAL APPLICABILITY

So far the light-emitting element according to the present invention, the method for producing the same, and the display device using the same have been described. The present invention provides a thin film EL element that has a high emission efficiency, that does not undergo defects such as irregularities or black points, that achieves light emission with excellent visibility by self generation at a low driving voltage, that undergoes a small decrease in the luminance even in a continuous emission test, and that can be used stably for a significantly long period of time with small power consumption. This is made possible by configuring the light-emitting element having at least a light-emitting region arranged between a pair of electrodes so that:

the light-emitting region contains either (A) a light-emitting material, a compound capable of sustaining the charge transport, and a heavy metal as a mixture, or (B) a compound that is capable of sustaining the charge transport and that includes both of a portion for contributing to the charge transport and a portion for contributing to the light emission within the compound itself, as well as a heavy metal; or in the foregoing case (A) or (B), each light-emitting region is composed of a layer made of the mixture of the foregoing materials by simultaneously depositing the above-described constituent components.

Further, the present invention makes it possible to provide a thin film EL element that requires only a low driving voltage and exhibits a high efficiency and high reliability, and that can be used stable for a significantly long period of time with small power consumption, even in the case of the pulse driving corresponding to the actual driving in a passive matrix panel.

The element may be configured so that:

more preferably, the compound capable of the charge transport includes both of a portion for contributing to the charge transport and a portion for contributing to the light emission within the compound;

more preferably, the compound is a hole-transport light-emitting material;

more preferably, a content of the heavy metal in the light-emitting region is not less than 0.1 mol % and not more than 50 mol % with respect to either the light-emitting material or the compound that includes both of a portion for contributing to the charge transport and a portion for contributing to the light emission; or more preferably, the heavy metal in the light-emitting region is mixed therein in as fine a particle state as possible, for instance, in an ultrafine particle state that is selected from an atomic particle state and cluster particle states in which each cluster particle has not more than ten atoms of the heavy metal on average, or further more preferably, in an ultrafine particle state that is selected from an atomic particle state and cluster particle states in which each cluster particle has not more than five atoms of the heavy metal on average.

In any one of these cases, the effects such as the improvement of the emission efficiency are exhibited more clearly.

Therefore, the present invention provides a useful thin film EL element, and the thin film EL element of the present invention can be used as a light source for use in a flat-panel-type self-luminous display device and for other various purposes such as communication and illumination.

The invention claimed is:

1. A light-emitting element having at least a light-emitting region between a pair of electrodes,
wherein the light-emitting region comprises a mixture of:
a light-emitting material;
a compound capable of sustaining charge transport; and
a heavy metal in an ultrafine particle state that is selected from an atomic particle state and cluster particle states in which each cluster particle has not more than ten atoms of the heavy metal on average.

2. A light-emitting element having at least a light-emitting region between a pair of electrodes,
wherein the light-emitting region comprises a mixture of a light-emitting material, a compound capable of sustaining charge transport, and a heavy metal in an ultrafine particle state that is selected from an atomic particle state and cluster particle states in which each cluster particle has not more than ten atoms of the heavy metal on average, the mixture being obtained by simultaneously depositing the light-emitting material, the compound, and die heavy metal.

3. The light-emitting element according to claim 1, wherein a content of the heavy metal in the light-emitting region is in a range of 0.1 mol % to 50 mol % with respect to the light-emitting material.

4. The light-emitting element according to claim 1, wherein the heavy metal mixed is in an ultrafine particle state that is selected from an atomic particle state and cluster particle states in which each cluster particle has not more than five atoms of the heavy metal on average.

5. A light-emitting element having at least a light-emitting region between a pair of electrodes,
wherein the light-emitting region comprises a mixture of:
a compound that is capable of sustaining charge transport and that includes both of a portion for contributing charge transport and a portion for contributing to light emission within the compound; and
a heavy metal in an ultrafine particle state that is selected from an atomic particle state and cluster particle states in which each cluster particle has not more than ten atoms of the heavy metal on average.

6. A light-emitting element having at least a light-emitting region between a pair of electrodes,
wherein the light-emitting region comprises a mixture of:
a compound that is capable of sustaining charge transport and that includes both of a portion for contributing charge transport and a portion for contributing to light emission within the compound; and
a heavy metal in an ultrafine particle state that is selected from an atomic particle state and cluster particle states in which each cluster particle has not more than ten atoms of the heavy metal on average,
the mixture being obtained by simultaneously depositing the compound and the heavy metal.

7. The light-emitting element according to claim 5, wherein the compound capable of sustaining the charge transport is a hole-transport light-emitting material that includes both of a portion for contributing to the charge transport and a portion for contributing to the light emission within the compound.

8. The light-emitting element according to claim 5, wherein a content of the heavy metal in the light-emitting region is in a range of 0.1 mol % to 50 mol % with respect to the compound that is capable of sustaining charge transport and that includes both of a portion for contributing charge transport and a portion for contributing to light emission within the compound.

9. The light-emitting element according to claim 5, wherein the heavy metal mixed is in an ultrafine particle state that is selected from an atomic particle state and cluster particle states in which each cluster particle has not more than five atoms of the heavy metal on average.

10. A light-emitting element having at least a light-emitting region between a pair of electrodes,
wherein the light-emitting region contains a mixture of:
a light-emitting material;
a compound capable of sustaining charge transport; and
a heavy metal in an ultrafine particle state that is selected from an atomic particle state and cluster particle states in which each cluster particle has not more than ten atoms of the heavy metal on average, and
the light-emitting region exhibits an increased ratio of light emission with respect to a recombination of unit charges, as compared with the case where the light-emitting region is made of a mixture of only a light-emitting material and a compound capable of sustaining charge transport.

11. A light-emitting element having at least a light-emitting region between a pair of electrodes,
wherein the light-emitting region contains a mixture of:
a compound that is capable of sustaining charge transport and that includes both of a portion for contributing charge transport and a portion for contributing to light emission within the compound; and
a heavy metal in an ultrafine particle state that is selected from an atomic particle state and cluster particle states in which each cluster particle has not more than ten atoms of the heavy metal on average, and
the light-emitting region exhibits an increased ratio of light emission with respect to a recombination of unit charges, as compared with the case where the light-emitting region is made of only a compound that is capable of sustaining charge transport and that includes both of a portion for contributing charge transport and a portion for contributing to light emission within the compound.

12. The light-emitting element according to claim 10, wherein the heavy metal mixed is in an ultrafine particle state that is selected from an atomic particle state and cluster particle states in which each cluster particle has not more than five atoms of the heavy metal on average.

13. The light-emitting element according to claim 1, wherein the heavy metal comprises a metal with an atomic number of not less than 57.

14. A method for producing a light-emitting element having at least a light-emitting region between a pair of electrodes, the method comprising:
forming at least one layer in the light-emitting region by simultaneously depositing a light-emitting material, a compound capable of sustaining charge transport, and a heavy metal,
wherein the heavy metal is deposited through a means that cracks the heavy metal.

15. A method for producing a light-emitting element having at least a light-emitting region between a pair of electrodes, the method comprising:
forming at least one layer in the light-emitting region by simultaneously depositing a compound that is capable of sustaining charge transport and that includes both of a portion for contributing charge transport and a portion for contributing to light emission within the compound, and a heavy metal,
wherein the heavy metal is deposited through a means that cracks the heavy metal.

16. The method for producing a light-emitting element according to claim 14, wherein the heavy metal comprises a metal with an atomic number of not less than 57.

17. A display device employing a plurality of light-emitting elements, each of the light-emitting elements having at least a light-emitting region between a pair of electrodes,
wherein the light-emitting region in each light-emitting element comprises a mixture of:
a light-emitting material;
a compound capable of sustaining charge transport; and
a heavy metal in an ultrafine particle state that is selected from an atomic particle state and cluster particle states in which each cluster particle has not more than ten atoms of the heavy metal on average.

18. A display device employing a plurality of light-emitting elements, each of the light-emitting elements having at least a light-emitting region between a pair of electrodes,
wherein the light-emitting region in each light-emitting element comprises a mixture of:
a compound that is capable of sustaining charge transport and that includes both of a portion for contributing charge transport and a portion for contributing to light emission within the compound; and
a heavy metal in an ultrafine particle state that is selected from an atomic particle state and cluster particle states in which each cluster particle has not more than ten atoms of the heavy metal on average.

19. The display device according to claim 17, wherein the heavy metal mixed is in an ultrafine particle state that is selected from an atomic particle state and cluster particle states in which each cluster particle has not more than five atoms of the heavy metal on average.

20. The display device according to claim 17, wherein the heavy metal comprises a metal with an atomic number of not less than 57.

21. A light-emitting element comprising an organic light-emitting layer that contains a heavy metal as a substance mixed therein
wherein the heavy metal mixed is in an ultrafine particle state that is selected from an atomic particle state and cluster particle states in which each cluster particle has not more than ten atoms of the heavy metal on average.

* * * * *